United States Patent [19]
Duerk et al.

[11] Patent Number: 5,709,207
[45] Date of Patent: Jan. 20, 1998

[54] AUDIO INFORMATION INCORPORATED WITHIN MRI PULSE SEQUENCES

[75] Inventors: Jeffrey L. Duerk, Avon Lake; Meera S. Nair; Dee Hung Wu, both of Cleve Hts; Jonathan S. Lewin, Beachwood, all of Ohio

[73] Assignee: Case Western Reserve University, Cleveland, Ohio

[21] Appl. No.: 618,750

[22] Filed: Mar. 20, 1996

[51] Int. Cl.$^6$ .................................................. A61B 5/05
[52] U.S. Cl. .................. 128/653.2; 324/307; 324/312; 324/309
[58] Field of Search ................... 128/653.1, 653.2, 128/653.5, 782, 897, 898, 920; 364/413.02, 413.13, 413.15; 324/322, 318, 307, 309, 312

[56] References Cited

U.S. PATENT DOCUMENTS

| | | |
|---|---|---|
| 4,307,343 | 12/1981 | Likes . |
| 4,878,499 | 11/1989 | Suzuki et al. . |
| 5,041,789 | 8/1991 | Keller et al. . |
| 5,144,242 | 9/1992 | Zeilenga et al. . |
| 5,203,346 | 4/1993 | Fuhr et al. . |
| 5,245,282 | 9/1993 | Mugler, III et al. . |
| 5,303,148 | 4/1994 | Mattson et al. ................. 364/413.01 |
| 5,363,844 | 11/1994 | Riederer et al. . |

*Primary Examiner*—Marvin M. Lateef
*Assistant Examiner*—Eleni Mantis Mercader
*Attorney, Agent, or Firm*—Fay, Sharpe, Beall, Fagan, Minnich & McKee

[57] ABSTRACT

Audio information is spoken into a microphone and saved in digitized form in an electronic file. The digitized information is converted into a format which is usable within a particular MRI system. Thereafter, a electronically store pulse sequence, useable within the selected MRI system, is selected and edited to incorporate the converted digitized verbal information and appropriate header information. When the edited pulse sequence is operated by the MRI system, audio information is projected which can be heard by the human ear using the elements of an existing MRI system.

18 Claims, 4 Drawing Sheets

AUDIO INFORMATION INCORPORATED WITHIN MRI PULSE SEQUENCES

BACKGROUND OF THE INVENTION

The present invention relates to Magnetic Resonance Imaging (MRI) arts. More particularly, the invention relates to providing audio information as part of an imaging pulse sequence, to provide instructions and other information to a patient undergoing a MRI procedure.

The basics of Magnetic Resonance Imaging are well known. Particularly, in a typical MRI system an object, such as the human body, is placed within a gradient magnetic construction which forms a uniform magnetic field. When the object is subjected to this uniform magnetic field, the nuclei in the object attempt to align with the polarizing field, but precess about it in random order at their characteristic Larmor frequency. Thereafter, the object is excited by a pulse sequence which acts to tip the nuclei. When a pulse is switched off, the nuclei precess back toward their equilibrium position during which a response is emitted and detected by an RF receiver. Numerous unique pulse sequences exist for MRI investigations.

When utilized to produce images, magnetic field gradients are employed. Typically, the region to be imaged is scanned by pulse sequences during which the field gradients vary according to the particular sequence used. The resulting set of received MRI signals are digitized and processed to reconstruct an image employing one of many well known reconstruction techniques. A pulse program generator or pulse sequence generator of the MRI system stores and uses the pulse sequences to provide signals that control the operation of the RF transmitters, RF receivers, gradient coils, etc. of a MRI system.

Software code which defines different pulse sequences is loaded into writable control storage areas of the pulse program generator. The code, which includes instructions, is a type of computer program that is executed by the pulse program generator to specify pulse program generator outputs and also specifies the duration of such outputs. Since the program generator is writable, various MRI pulse sequences can be specified by simply downloading different instructions into the pulse program generator control storage. Thus, different instruction sequences corresponding to numerous MRI pulse sequences are able to be maintained on a host computer storage and downloaded for use by the MRI system.

The pulse sequences which typically have been provided to a pulse program generator have been limited to those which are capable of being analytically expressed, such as those based on sine, cosine, tangent, and exponential functions. However, very recently, MRI systems have been developed which allow the downloading of arbitrary signal patterns to the pulse program generator, allowing an arbitrary pattern of signals to be used as the pulse sequence controlling the gradient coils of an MRI system.

The development of a variety of pulse sequences, as well as the overall improvement of MRI systems have greatly increased the availability of reconstructed images produced by MRI systems. It is known, however, that MRI is sensitive to motion and that this motion can lead to artifacts which limit the diagnostic utility of the images. Gross patient motion, respiration, blood flow, heart contraction are all examples of patient motion that contribute to artifacted images. Therefore, to obtain high quality images the cooperation of the patient is an important factor.

Currently, emphasis is placed on the MRI technician to provide spoken commands such as "hold your breath", "lie still", to the patient at the appropriate time during a scan. However, the choice of the appropriate time is more often arbitrary and relies heavily on the skill, experience, memory and motivation of the technician involved. This can introduce an additional element of human error into the data acquisition process.

To provide these instructions, existing MRI installations use separate audio speakers and microphones for communication between the patient and the technologist operating the MRI system. These communication devices are essentially intercoms separate from the MRI system. The instructions or information provided to the patient can be made directly by the technologist through the microphone or can be made by a voice reproduced from a recorded tape or from a voice synthesizer.

Under the present state of the art, the instructions or information provided by the technologist are at times unreliable and inconsistent as it is difficult for technologists to provide the instructions or information given the rapid pace of activity in the MRI environment. Further, the timing when instructions or commands are given relative to the actual MRI data acquisition is not consistent and could cause a patient to perform an action at an inappropriate or for too long a time, such as holding their breath for a period greater than necessary. Still further, since the existing communication devices are separate from the MRI system they require hardware and maintenance separate from the MRI system.

Therefore, it has been deemed desirable to provide patient instructions or information in a reliable manner that ensures consistent performance of patient commands during the rapid pace of activity in the MRI environment.

It has also been determined useful to find a manner of ensuring that better timing of commands relative to actual data acquisition, thus, for example, minimizing the time the patient is required to hold their breath, etc.

Further, a method which does not require additional hardware, but rather uses the existing MRI system to produce reliable consistent audio information is also considered desirable.

Still further, providing these commands for a variety of different MRI systems and/or a plurality of MRI pulse sequences for automatic production of the commands is considered to be beneficial.

SUMMARY OF THE INVENTION

The present invention contemplates a new and improved manner of providing audio information in the form of a spoken voice to a patient undergoing a MRI procedure, that overcomes all of the above noted problems and others, in an economical manner.

According to a more limited aspect of the invention, a method is provided where audio instructions and/or information in the form of a spoken voice are projected to a microphone and stored in a digitized form. The digitized information is then converted into a string of ASCII numbers, and appropriate header information is added to meet the requirements of a specific existing MRI system's software/hardware. This information is then incorporated and stored within a MRI pulse sequence. Thereafter, when the pulse sequence is used by a pulse program generator the stored copy of the spoken audio information is automatically generated for the patient.

According to yet another aspect of the invention, the audio information is stored in a pulse sequence before, during or after various portions of the MRI examination.

According to yet another aspect of the invention, the stored copy of the spoken information is incorporated within a variety of MRI pulse sequences.

A principal advantage of the invention is providing a MRI system which automatically issues copies of spoken instructions or information to add reliability to MRI procedures by ensuring the consistent performance of patient instructions and to ensure better timing of the instructions relative to actual MRI data acquisition.

Another advantage of the invention resides in using the existing configurations of MRI systems to provide the audio instructions or information without requiring any additional hardware changes to the MRI system.

Still other advantages and benefits of the invention will become apparent to those skilled in the art upon a reading and understanding of the following detailed description.

BRIEF DESCRIPTION OF THE DRAWINGS

The invention may take physical form in certain parts and arrangements of parts, a preferred embodiment of which will be described in detail in this specification and illustrated in the accompanying drawings which form a part hereof, and wherein.

DETAILED DESCRIPTION OF THE PREFERRED EMBODIMENT

Figure 1:
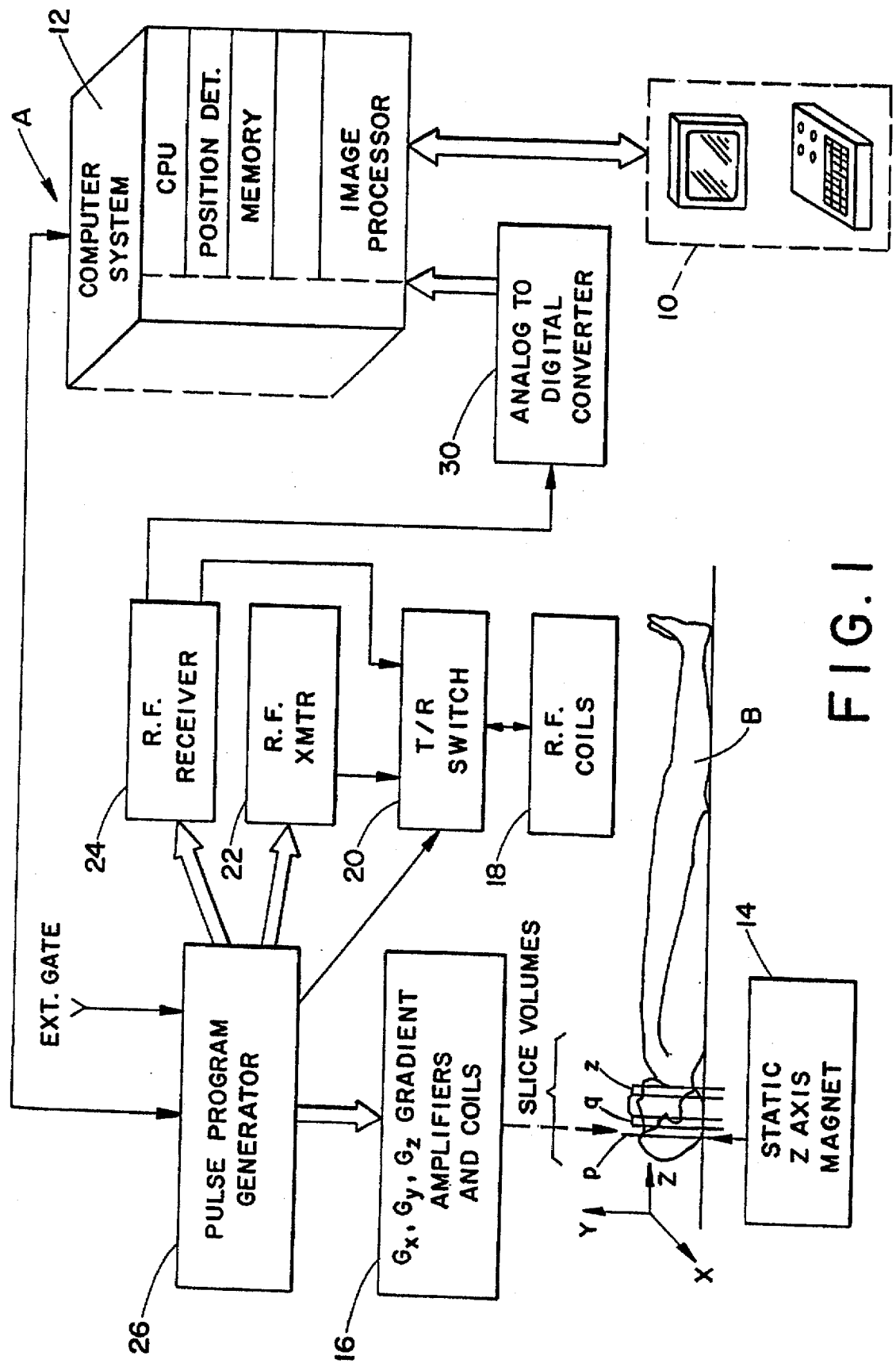
FIG. 1 is directed to a block diagram which illustrates the general construction of a MRI system which incorporates the present invention.

The block diagram of FIG. 1 sets forth the major components of a preferred MRI system A which incorporates the present invention. The operation of this system is controlled from an operator console 10 which includes a control panel and display. The console 10 communicates with computer system 12 enabling an operator to control the production and display of images on the console display.

Typically, a human or animal subject (or any other object to be imaged) B is placed within a static magnetic field. For example, the subject may lie along the z-axis of a static magnet 14 which establishes a substantially uniform magnetic field directed along the z-axis within the portion of the object B of interest. For example, contiguous parallel slice-volumes p, q . . . z are located within the volume to be imaged. Gradients are imposed within this z-axis directed magnetic field along mutually orthogonal x, y, z-axes by a set of Gx, Gy, Gz gradient amplifiers and coils 16 to phase encode the resulting MRI response signals which are then generally read out with the gradients turned off. The RF signals are transmitted into the object B and the RF responses are received from the object via RF coils 18 connected by a conventional transmit/receive (T/R) switch 20 to an RF transmitter 22 and RF receiver 24. As will be appreciated by those in the art, separate transmit and receive coils may be used in some installations, in which case the T/R switch 20 may not be needed.

All the above mentioned elements may be controlled by a pulse program generator 26 which communicates with computer system 12, which may also receive MR responses via an analog-to-digital converter 30.

The pulse program generator 26 operates the system components to carry out the desired scan sequence. It produces data which indicates the time, strength and shape of the RF pulses which are to be produced, and the timing of and length of the data acquisition window. The pulse program generator 26 is connected to the set of gradient amplifiers and coils 16 to indicate the timing and shape of the gradient pulses to be produced during a scan.

The gradient waveforms produced by the pulse program generator 26 are applied to the gradient amplifier system 16 with each gradient amplifier exciting a corresponding gradient coil to produce the magnetic field gradients used for position encoding of acquired signals.

As will be apparent to those in the art, such an arrangement may be utilized to generate desired sequences of magnetic gradient pulses and RF pulses and to measure the desired responses in accordance with the stored compute programs.

In particular, computer system 12 stores a library of routines corresponding to useful MRI pulse sequences. An operator may select and also edit or otherwise manipulate desired routines from the library via console 10, and then command computer system 12 to download such routines to pulse program generator 26 for execution. Computer system 12 receives the digitized RF responses and processes those digitized responses via image reconstruction and other conventional techniques to provide, on console 10 or other display, one or more images corresponding to body B.

Up until very recently, approximately within the last two years, MRI systems were only able to implement pulse sequences based on waveforms or patterns which could be described by an analytical function or expression, such as sine, cosine, tangent, exponential functions, etc. However, MRI systems now exist which are capable of delivering arbitrary shape current waveforms to gradient coils.

As can be confirmed by the above system description, and as well documented in the art, when a scan controlled by a pulse sequences is undertaken, a "knocking" sound occurs. It is known that this "knocking" sound exists due to the physical construction of the MRI system. Particularly, MRI systems have all the required components to emulate an audio speaker. There exists a large magnet forming a magnetic field and windings (i.e. the gradient windings) perpendicular to the magnetic field which are capable of carrying current. In the conventional imaging described above, these windings will have time dependent currents applied to them from the MRI gradient amplifiers. The specific shape of the current waveform provided to the gradient amplifiers will produce a temporal and spatial variation in the otherwise homogenous magnetic field in a manner needed to perform spatial localization.

The interaction of the current carrying conductors of the gradient coils and the magnetic field produces a force within the MRI system which causes microscopic flexing of electronic and other elements resulting in the "knocking" during the MRI pulse sequences. Specifically, the "knocking" sound reflects the pulse patterns of a particular MRI pulse sequence. This "knocking" has been considered an unwanted by-product of the MRI data acquisition process.

The present inventors have noted that with the advancement of the most recent MRI systems the phenomena which causes the undesirable "knocking" can be applied to a beneficial use. Specifically, audio instructions or information, in the form of a spoken voice, which is an arbitrary type waveform pattern, can be incorporated into the pulse sequences used by pulse program generator 26.

Figure 2:
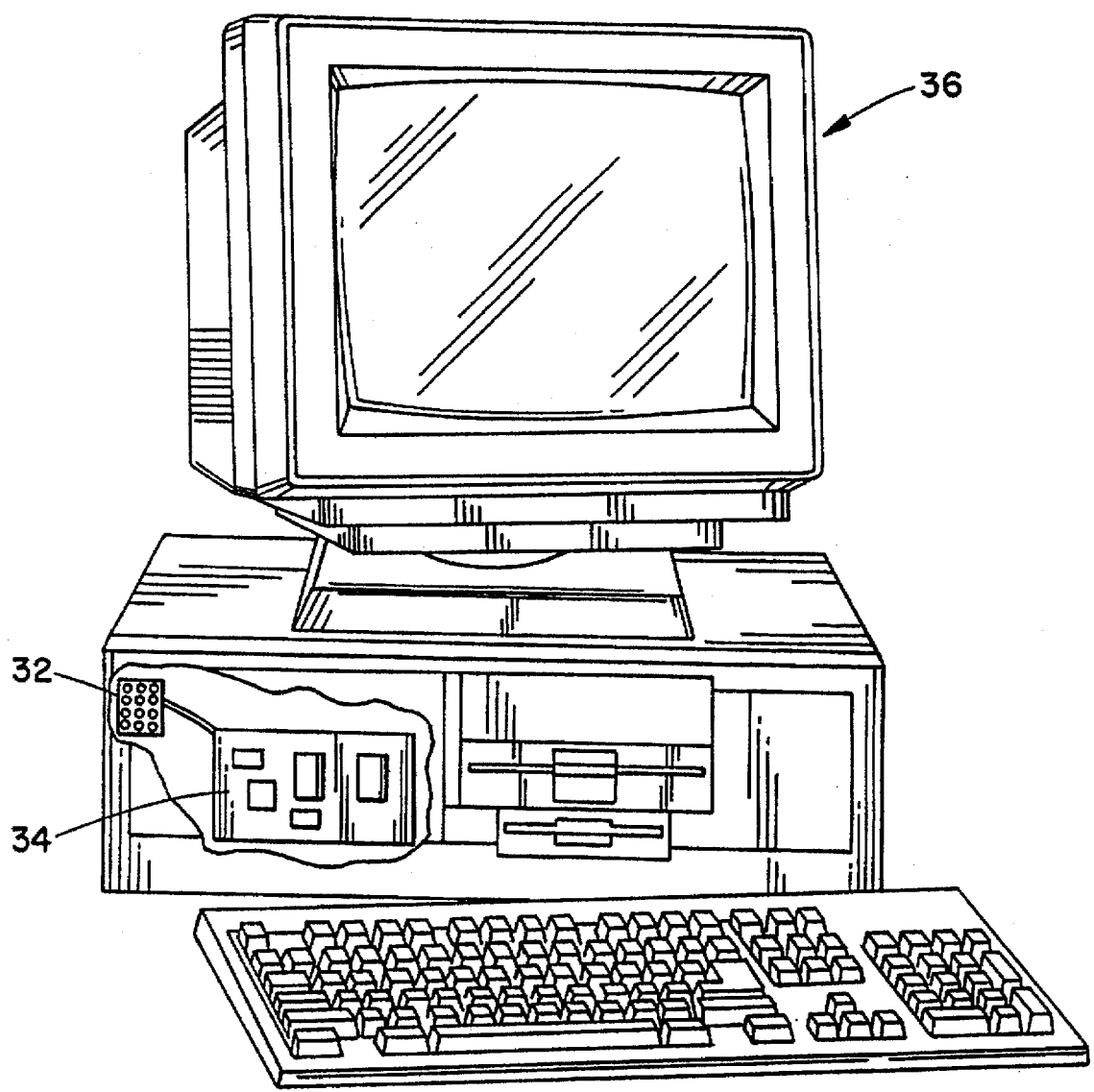
FIG. 2 illustrates a system for digitizing audio voice input instructions or information.

To accomplish the above, instructions or information, in the form of a spoken voice, are projected into a microphone, digitized and stored in an electronic file. FIG. 2 illustrates one manner of doing such digitizing, wherein a person speaks into a microphone 32 which is connected to or is part of sound card 34 of personal computer 36. The person can issue specific audio commands such as "hold your breath", "breath", "don't move", a tutorial on what the examination will sound like, etc., which will be digitally stored in a file.

This digitized file is then converted into a format that can be made compatible with data used for generation of the pulse sequences. In one embodiment, the spoken information may be stored in what is known as a *.WAV file, which is commonly used to store spoken words in sound card systems. The *.WAV file is converted to a string of ASCII characters such as numbers. The software which is for this conversion from the *.WAV file to ASCII characters is well known in the art.

The converted (ASCII) audio information, has added to it appropriate header and other information for a particular MRI. The different MRI systems use specific information, such as a header information, which allow for communication within the particular MRI system. For example, a pulse sequence which is to be used in a MRI procedure needs to be coded so it can function according to the specifics of the MRI system. Such coding, which is well known in the art, can vary from one MRI system to another.

Next, the converted audio information and information specific to the MRI system is incorporated into the MRI pulse sequence. This is done by editing an existing coded pulse sequence file, or by including the audio information during the initial coding of a pulse sequence. Providing the header information etc. and the incorporation into a coded pulse sequence, is accomplished by the same steps used to originally code the pulse sequence and would be known to one skilled in the art.

Figure 3:
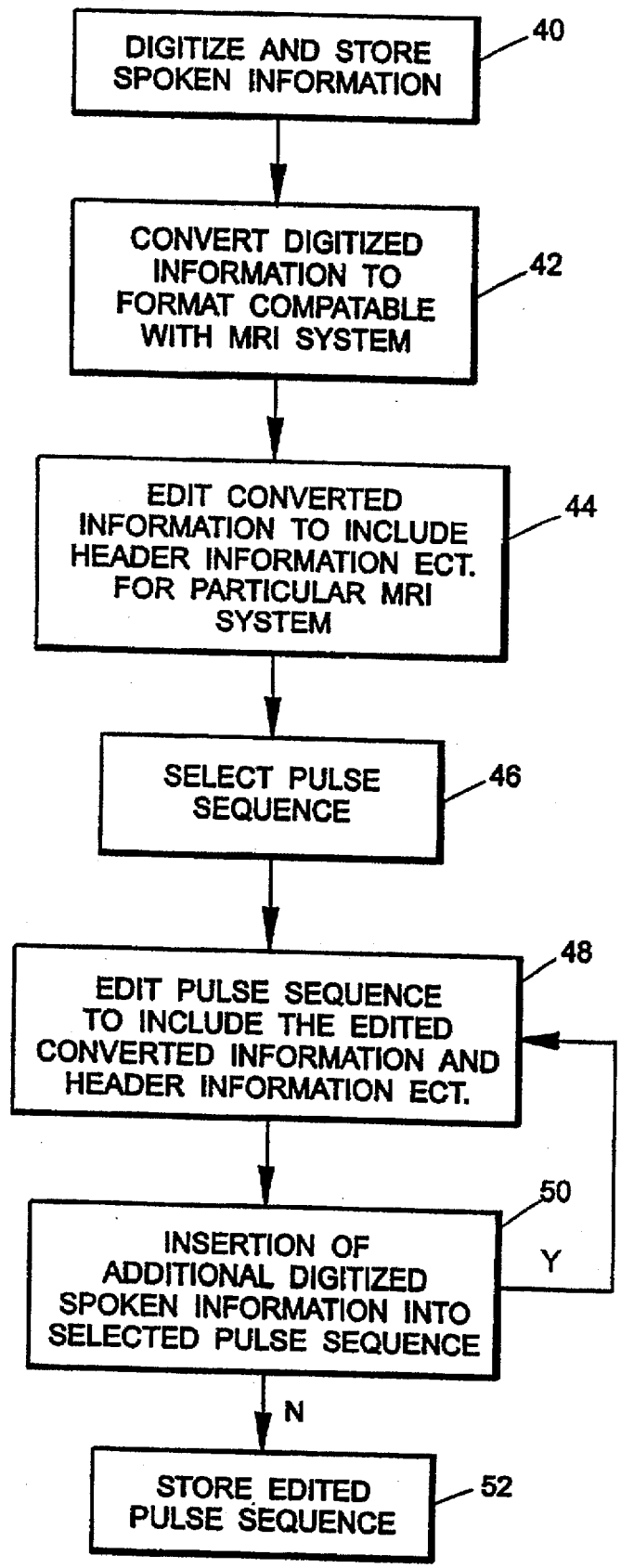
FIG. 3 provides a flow chart of the operation according to the subject invention.

As illustrated in FIG. 3, the sequence of operation discussed above includes digitizing audio instructions or information to a digitized file 40. Next, the digitized file is converted to a format which can be made compatible to a particular MRI system (for example from the digitized file to a string of ASCII numbers) 42. This converted file is then edited to include appropriate header information and/or other data which corresponds to a particular MRI system 44. The next step includes selecting a particular known pulse sequence 46. The pulse sequence file is edited 48 by inserting the audio instructions and/or information which have been converted into a useable data format, at selected locations of the pulse sequence. At step 50 the process inquires as to whether another command exists which is to be inserted, if the answer is yes the process shifts back to step 48 and another command is inserted. If the response is no, the process drops to step 52 where the edited pulse sequence is stored.

The above process can be repeated for the plurality of different pulse sequences thereby creating a library of pulse sequences including automatic/automated audio instructions and information. Thereafter, when a MRI scan is undertaken using the pulse sequences containing audio instructions and/or information, the MRI system is used as an audio speaker, before, during, or after various portions of the MRI examination, to issue pre-"recorded" patient instructions or information.

The inventors have performed trials of this system wherein a command "hold your breath" was spoke into a microphone connected to the sound card of a personal computer. The digitized file was then converted from a *.WAV file to a string of ASCII numbers, and appropriate header information was added to meet the requirements specific to the existing MRI system's software/hardware. This data was then incorporated into an MRI pulse sequence and the edited pulse sequence was used in a scan operation wherein the pre-recorded audio instruction was provided at the start of the MRI sequence.

Each time a pulse sequence according to the subject invention is used, a command will automatically be given consistently at the same point within the procedure and will not be dependant upon the skill of the technologist. It is to be appreciated that these instructions should not be placed into pulse sequences at arbitrary locations but care must be taken that they be placed at locations when the signals required for imaging and data acquisition are not active.

Thus, the present invention uses existing components of the MRI imager to provide audio information to patients and does not require a separate speaker and microphone for the technologist.

Figure 4:
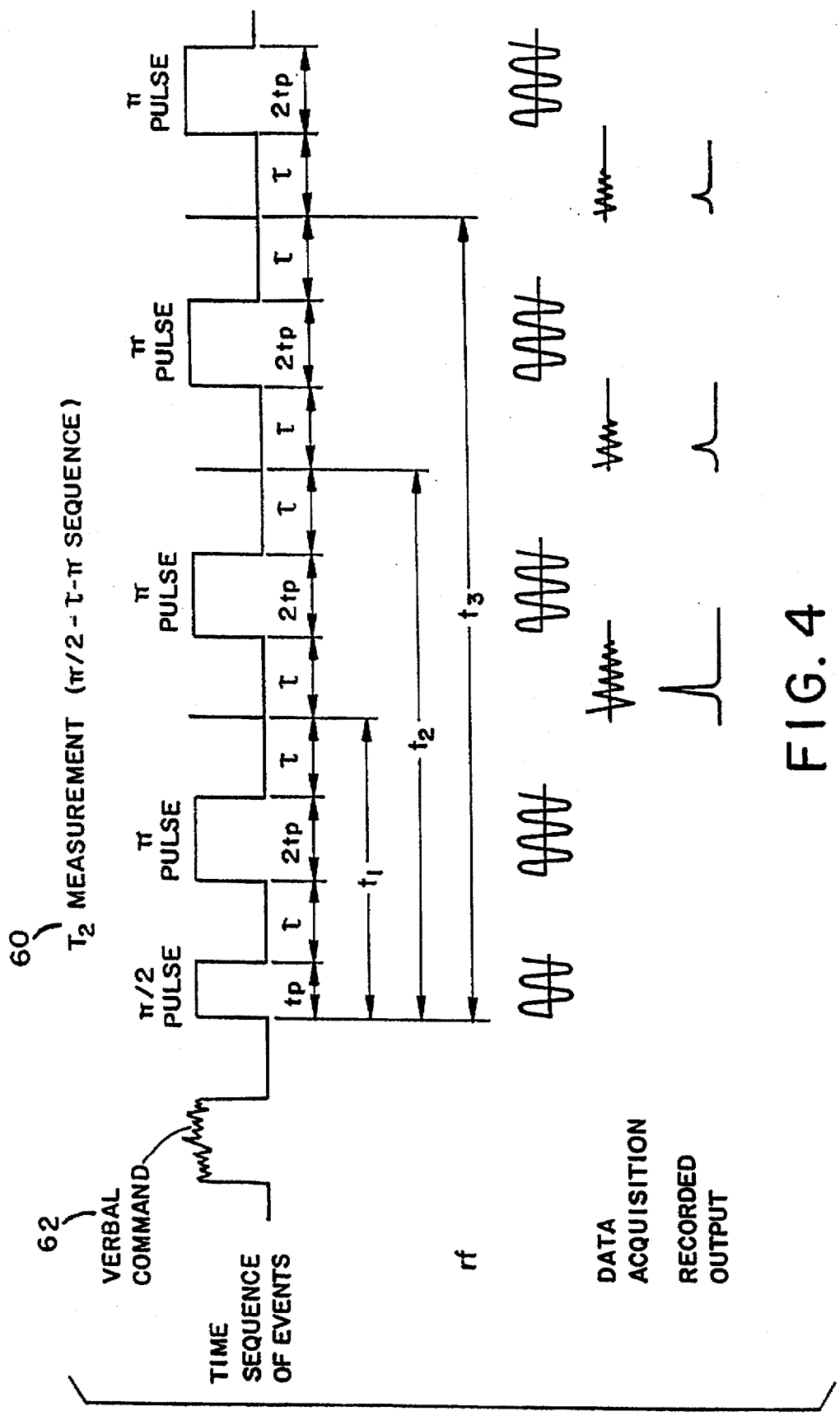
FIG. 4 provides an illustration of a pulse sequence with instructions incorporated at desired locations.

The audio instructions or information can be inserted into any of the numerous pulse sequences which have been designed to yield various specific information, including many well known sequences or techniques such as, a free induction decay (FID) sequence, an inversion-recovery sequence, and spin-echo sequence, among many others. A particular example of a pulse sequence is illustrated in FIG. 4. This method is usually referred to as the spin-echo technique 60. Since $T_2$ is a measure of the properties of the magnetization perpendicular to the field direction, a first pulse is $\pi/2$ pulse. All subsequent pulses are $\pi$ pulses which keep the residual magnetization in the perpendicular plane and just flip it from side to side, bringing the de-phased nuclei back into phase (echo).

As illustrated in FIG. 4, an audio instruction 62 according to the subject invention can be inserted prior to the initial $\pi/2$ pulse. It is also possible that at other locations, where there is inactivity of either data generation or data acquisition, additional information represented by arbitrary waveform patterns may be inserted.

The invention has been described with reference to the preferred embodiment. Obviously, modifications and alterations will occur to others upon a reading and understanding of this specification. It is intended to include all such modifications and alterations insofar as they come within the scope of the appended claims or the equivalents thereof.

Having thus described the invention it is now claimed:

1. A method of incorporating audio information into a pulse sequence of a Magnetic Resonance Imaging (MRI) system, the method comprising the steps of:

projecting audio information in the form of a spoken voice into a microphone;

digitizing and storing the projected audio information in a first electronic file;

converting the stored digitized audio information to a format of data useable with the MRI system;

storing the converted digitized audio information and information specific to the MRI system, in a second electronic file;

selecting a pulse sequence; and incorporating the converted digitized verbal information and information specific to the MRI system as part of the pulse sequence.

2. The method according to claim 1 wherein the digitized audio information is converted into a string of ASCII characters.

3. The method according to claim 1 wherein the information specific to the MRI system is header information.

4. The method according to claim 1 wherein the selected pulse sequence is stored in a third electronic file and the incorporating step further includes editing the third electronic file by inserting a string of ASCII characters representing the digitized audio information and information specific to the MRI system.

5. The method according to claim 4 wherein the ASCII characters represent arbitrary shaped current waveforms which are to be supplied to gradient coils of the MRI system.

6. The method according to claim 1 wherein the converted digitized audio information is located within the pulse sequence where no pulse generating information exists.

7. A method of incorporating verbal information into a pulse sequence of a Magnetic Resonance Imaging (MRI) system, the method comprising the steps of:

projecting audio information in the form of a spoken voice into a microphone;

digitizing and storing the projected audio information in a first electronic file;

converting the stored digitized audio information to a string of ASCII characters;

storing the string of ASCII characters and header information specific to the MRI system, in a second electronic file;

selecting a pulse sequence stored in a third electronic file; and editing the pulse sequence in the third electronic file by inserting the string of ASCII characters and header information at an appropriate location.

8. The method according to claim 7 further including a step of connecting the microphone to a voice card of a personal computer.

9. The method according to claim 7 further including storing the data of the edited third electronic file to a pulse program generator; and operating the pulse program generator whereby, audio information stored in the third electronic file is projected by the use of the construction of the MRI system.

10. The method according to claim 7 wherein the digitized audio information represents arbitrary shaped current waveforms which are to be supplied to gradient coils of the MRI system.

11. The method according to claim 7 wherein the appropriate location is at a position other than during periods of data generation and data acquisition.

12. A method of generating verbal commands using elements of a Magnetic Resonance Imaging (MRI) system, the method comprising:

storing a digitized command;

selecting a pulse sequence used by the MRI system;

storing the digitized command within the selected pulse sequence at a location where no pulse generating information exists; and activating the pulse sequence, wherein when the stored digitized command of the pulse sequence is reached, a verbal command corresponding to the stored digitized command is produced.

13. The method according to claim 12 further including:

storing a plurality of digitized commands;

storing a plurality of the pulse sequences;

selecting ones of the plurality of digitized commands; and storing the selected digitized commands into selected ones of the plurality of pulse sequences.

14. The method according to claim 12 wherein during the step of activating, the MRI system emulates an audio speaker.

15. The method according to claim 14 wherein providing a specific shape of a current waveform to gradient amplifiers produces a temporal and spatial variation in an otherwise homogenous magnetic field in a manner needed to perform spatial localization, and wherein interaction of current carrying conductors of gradient coils and a magnetic field produces a force within the MRI system, causing microscopic flexing of elements of the MRI device.

16. The method according to claim 15 including forming the digitized commands as arbitrary type waveforms.

17. The method according to claim 12 wherein at least two of the plurality of digitized commands are stored in a single pulse sequence.

18. The method according to claim 12 wherein activating the pulse sequences, causes a varying of field gradients of the MRI system.

* * * * *